(12) United States Patent
Al-Qaq et al.

(10) Patent No.: US 10,230,408 B2
(45) Date of Patent: Mar. 12, 2019

(54) MEASUREMENT RECEIVER HARMONIC DISTORTION CANCELLATION

(71) Applicant: Futurewei Technologies, Inc., Plano, TX (US)

(72) Inventors: Wael Al-Qaq, Oak Ridge, NC (US); Hong Jiang, Kernersville, NC (US)

(73) Assignee: Futurewei Technologies, Inc., Plano, TX (US)

(*) Notice: Subject to any disclaimer, the term of this patent is extended or adjusted under 35 U.S.C. 154(b) by 356 days.

(21) Appl. No.: 15/016,909

(22) Filed: Feb. 5, 2016

(65) Prior Publication Data

US 2017/0230067 A1 Aug. 10, 2017

(51) Int. Cl.
*H04B 1/04* (2006.01)
*H04W 24/08* (2009.01)

(52) U.S. Cl.
CPC ......... *H04B 1/0475* (2013.01); *H04B 1/0483* (2013.01); *H04W 24/08* (2013.01); *H04B 2001/0408* (2013.01)

(58) Field of Classification Search
CPC .... H04B 1/0475; H04B 1/0483; H04B 1/525; H04B 1/62; H04B 1/109; H04B 10/58; H04B 10/2507; H04B 2001/485; H04B 3/46
See application file for complete search history.

(56) References Cited

U.S. PATENT DOCUMENTS

| | | | | |
|---|---|---|---|---|
| 5,787,126 A | * | 7/1998 | Itoh et al. | H04L 25/067 375/340 |
| 2006/0088124 A1 | * | 4/2006 | Mizuta et al. | H04L 25/49 375/296 |
| 2015/0222319 A1 | * | 8/2015 | Imbornone et al. | H04B 1/48 455/82 |
| 2015/0295545 A1 | * | 10/2015 | Onishi | H04B 1/0475 455/114.3 |

* cited by examiner

*Primary Examiner* — Ian N Moore
*Assistant Examiner* — Brian T Le
(74) *Attorney, Agent, or Firm* — Schwegman Lundberg & Woessner, P.A.

(57) ABSTRACT

A transmitter includes a power amplifier coupled to amplify an input signal and provide an output signal. A radio frequency coupler is coupled to receive the output signal and provide a measured signal on a coupler output. A measurement receiver multiplexor is coupled to receive the measured signal on the coupler output to produce either a non-phase adjusted signal or a phase adjusted signal on one of a plurality of multiplexor outputs. Multiple receiver paths are coupled to the plurality of multiplexor outputs to receive either the non-phase adjusted signal or the phase adjusted signal. Receive path processing circuitry is configured to produce in-phase and quadrature phase digital signals based on the plurality of multiplexor outputs to digital processing circuitry to cancel $3^{rd}$ or $3^{rd}$ and $5^{th}$ order measurement receiver distortions.

16 Claims, 5 Drawing Sheets

MEASUREMENT RECEIVER HARMONIC DISTORTION CANCELLATION

TECHNICAL FIELD

The present application is related to transmitter calibration and in particular to transmitter calibration via measurement receiver harmonic distortion cancellation.

BACKGROUND

Linear I/Q transmitters typically use a square wave local oscillation (LO) signal to drive their mixers. This normally results in $3^{rd}$ and $5^{th}$ order harmonic-related distortions (HD3 & HD5) that fall relatively close in frequency to the desired transmit signal. These distortions are typically generated by mixing of the resulting mixer output signal harmonics inside the nonlinear RF output stage of a radio frequency transceiver such as a radio frequency integrated circuit (RFIC) as well as a nonlinear power amplifier. Such harmonic distortions typically result in spurious emissions and require calibration of circuitry in a transmitter (Tx) path responsible for cancelling these Tx harmonic distortions.

SUMMARY

A transmitter includes a power amplifier coupled to amplify an input signal and provide an output signal. A radio frequency coupler is coupled to receive the output signal and provide a measured signal on a coupler output. A measurement receiver multiplexor is coupled to receive the measured signal on the coupler output to produce either a non-phase adjusted signal or a phase adjusted signal on one of a plurality of multiplexor outputs. Multiple receiver paths are coupled to the plurality of multiplexor outputs to receive either the non-phase adjusted signal or the phase adjusted signal. Receive path processing circuitry is configured to produce in-phase and quadrature phase digital signals based on the plurality of multiplexor outputs to digital processing circuitry to cancel $3^{rd}$ or $3^{rd}$ and $5^{th}$ order measurement receiver distortions.

A method includes providing a reference digital tone to a transmitter circuit, measuring an output of the transmitter circuit responsive to the reference digital tone, separating the measured output into phase separated paths, determining measured output desired (fundamental) signal, $3^{rd}$ order, and $5^{th}$ order distortion components, and correlating the components with the reference digital tone and its harmonics to generate a scaling factor to eliminate or reduce $3^{rd}$ and $5^{th}$ order measurement receiver distortions.

A further method includes receiving a signal at a transmitter circuit, measuring an output of the transmitter circuit responsive to the received signal, producing phase adjusted outputs based on the measured transmitter circuit output, determining measured output desired (fundamental) signal, $3^{rd}$ and $5^{th}$ order distortion components phase adjusted outputs, determining a scaling factor based on the measured output desired signal, $3^{rd}$ and $5^{th}$ order distortions to cancel the measurement receiver $3^{rd}$ and $5^{th}$ order distortions from the measured outputs of the transmitter circuit.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

The functions or algorithms described herein may be implemented in software in one embodiment. The software may consist of computer executable instructions stored on computer readable media or computer readable storage device such as one or more non-transitory memories or other type of hardware based storage devices, either local or networked. Further, such functions correspond to modules, which may be software, hardware, firmware or any combination thereof. Multiple functions may be performed in one or more modules as desired, and the embodiments described are merely examples. The software may be executed on a digital signal processor, ASIC, microprocessor, or other type of processor operating on a computer system, such as a personal computer, server or other computer system, turning such computer system into a specifically programmed machine.

Calibrating the Tx Circuitry to reduce transmit path distortions normally requires measuring third (HD3) and fifth (HD5) harmonic distortions. This may be done using a built-in radio frequency integrated circuit (RFIC) measurement receiver (MRx). However, the MRx itself suffers from similar harmonic distortions since it also uses a square wave LO to drive its down-conversion mixers. MRx self-generated HD3 & HD5 in many cases cloud the very Tx harmonic distortions intended to be measured and reduced with calibration making the Tx calibration process in many cases inaccurate and ineffective.

To help eliminate the impact of measurement receiver (MRx) harmonic distortion on transmitter (Tx) harmonic distortion measurement, a −45 Deg/0 Deg/+45 Deg phase shifting unit is inserted in between the Tx and MRx. Three Tx harmonic distortion measurements are then captured using these three phase settings. Adding the resulting three measurements in the digital domain cancels out the MRx HD3 and HD5 and amplifies the Tx HD3 and HD5 intended to be measured thereby improving significantly the accuracy of the Tx harmonic distortion calibration process.

A transmitter is first described, followed by a description of test circuitry for calibration of the transmitter using a digital tone and a measurement receiver with a phase shifting unit to reduce measurement receiver harmonic distortion impact on the Tx harmonic distortion to be measured.

Figure 1:
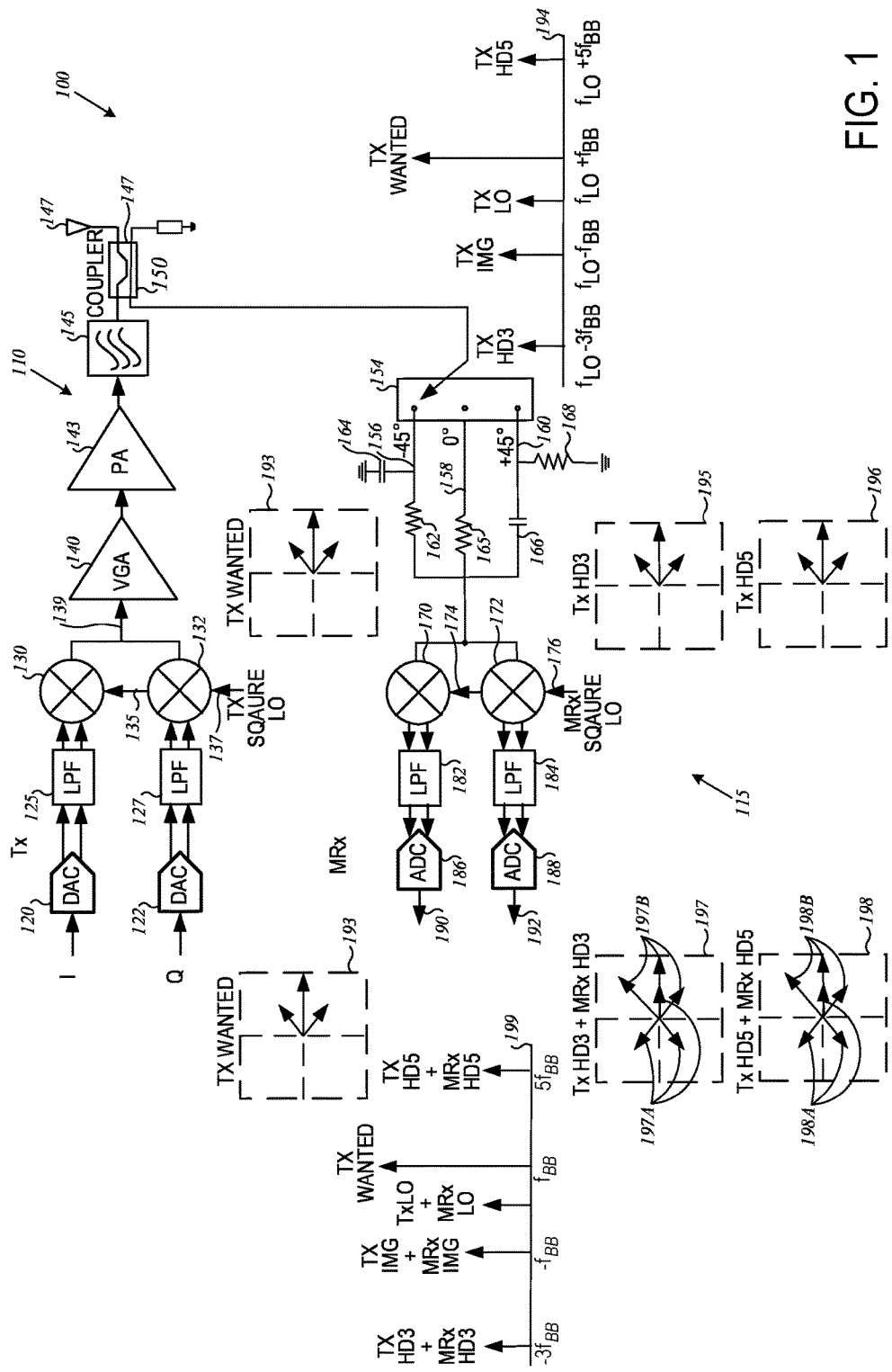
FIG. 1 is a block schematic diagram of a transmitter with measurement receiver distortion utilized to cancel transmitter distortion according to an example embodiment.

FIG. 1 is a block diagram of a transmitter 100 having a transmitter portion indicated generally at 110 and a measurement receiver portion indicated generally at 115. Transmitter 110 receives two digital input signals I and Q at digital to analog converters (DAC) 120 and 122, which provide analog signals to low pass filters 125, 127. The output of the low pass filters is upconverted to radio frequency by mixers 130, 132 with local oscillator (LO) square signals at 135, 137 to provide a combined RF signal on line 139 to a variable gain amplifier (VGA) 140. An output of VGA 140 is provided to power amplifier 143, which provides a power amplified combined radio frequency (RF) transmitter signal to a front-end filter indicated at 145 to an antenna 147 for transmission. An RF coupler 150 is inserted between the front-end filter 145 and antenna 147 to measure the transmitter 110 output. The front-end filter typically suppresses the out-of-band PA harmonics but cannot suppress the transmitter close in HD3/HD5 distortions.

A measured transmitter output is provided to a multiplexor 154 of the measurement receiver shown generally at 115, which multiplexes the received signal between three different measurement receiver paths as indicated at 156, 168, and 160. The receiver paths provide for measurement of three different phases of the received signal at −45°, 0°, and +45°, respectively, in the described embodiment. To accomplish the separation of phases, each of the paths utilizes different components to introduce desired phase shifts. Path 156 includes a resistor 162 and a capacitor 164 coupled to ground to provide the −45° phase shift. Path 158 uses a resistor 165 for the 0° phase (no phase shift). Path 160 uses a capacitor 166 coupled to a resistor 168 which is coupled to ground to provide the 45° phase shift. Thus, paths 156, 158 and 160 provide a RC/bypass/CR network with phase settings, Ph=−45 Deg, 0 Deg, +45 Deg, respectively.

The different phases of the measured signal are provided via mixers 170, 172 after being mixed with a measurement receiver square LO signal indicated at 174 and 176 to downconvert the signals from RF to a lower frequency signals (e.g., either an intermediate frequency or baseband frequency signal). After mixing and downconverting, the signals are coupled via respective low pass filters (LPFs) 182, 184 and ADCs 186 and 188 for conversion to digital measurement in phase (I) and quadrature (Q) phase receiver signals on lines 190 and 192.

FIG. 1 also illustrates a graph of a desired transmit signal at 193 showing amplitudes at different phases. Multiple measured signal amplitudes are shown along a frequency axis in a graph at 194. The graph 194 shows a Tx HD3 and Tx HD5 which are $3^{rd}$ and $5^{th}$ order distortions respectively due to mixing of Tx wanted and Tx square LO. Note that Tx HD3 occurs at a frequency of $f_{LO}-3f_{BB}$. Tx IMG occurs at a frequency of $f_{LO}-f_{BB}$. Tx wanted occurs at a frequency of $f_{LO}+f_{BB}$. Tx HD5 occurs at a frequency of $f_{LO}+5f_{BB}$. MRx-generated Nth order harmonic distortion from Tx wanted signal with a phase shift Ph produces N×Ph phase shift at MRx output, where for 3rd order distortion, N=−3 and for 5th order distortion, N=5

Transmitter HD3 and HD5 signals with phase are shown at 195 and 196, respectively. At the measurement receiver output, the transmitter and measurement receiver harmonic distortions add as shown at 197 and 198. The measurement receiver signals at the HD3 components are shown at 197A, while the transmitter HD3 frequencies are shown at 197B. Similarly, the measurement receiver signals at the HD5 components are shown at 198A, while the transmitter HD5 frequencies are shown at 198B. At the MRx output, desired Tx HD3 and Tx HD5 components add constructively while unwanted MRx distortion MRx HD3 and MRx HD5 add destructively. The composite signal is indicated along a frequency axis in a graph at 199. Note that Tx HD3+MRx HD3 occurs at a frequency of $-3f_{BB}$. Tx IMG+MRx IMG occurs at a frequency of $-f_{BB}$. Tx wanted occurs at $f_{BB}$. Tx HD5+MRx HD5 occurs at a frequency of $5f_{BB}$.

Figure 2:
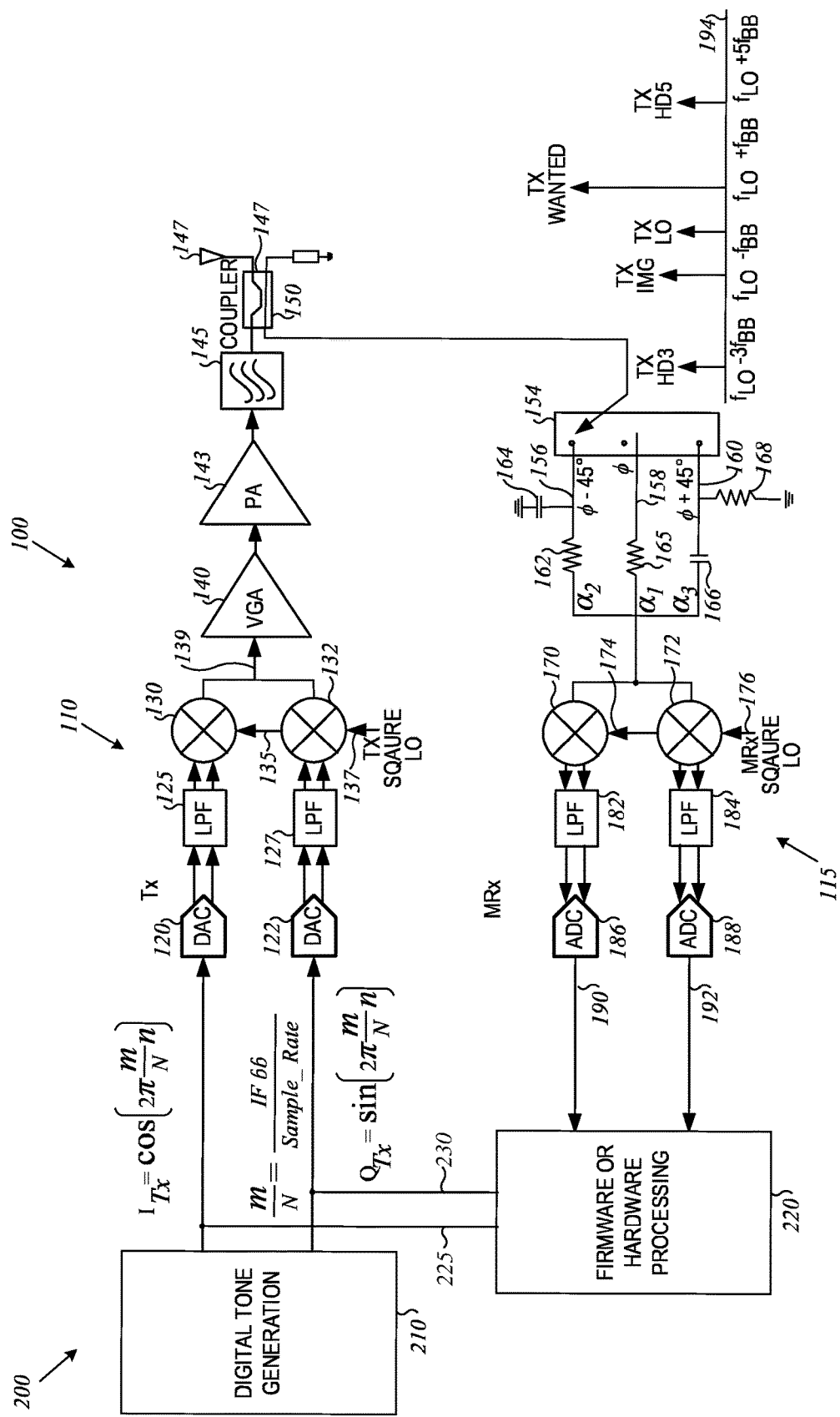
FIG. 2 is a block schematic diagram of the transmitter of FIG. 1 including test tone generation and correction calculation circuitry according to an example embodiment.

FIG. 2 is a block diagram 200 illustrating the transmitter 100 that includes a digital tone generator and a calibration calculator. A digital tone generator 210 is coupled to provide a digital test tone to the DACs 120 and 122. The digital test tone is a continuous wave (CW) test tone transmitted with intermediate frequency (IF) $f_{BB}$. A calibration calculator indicated as firmware or hardware processing 220 captures three measurements using MRx 115 for three phases, ph−45, ph, ph+45. In various embodiments, the firmware or hardware processing 220 receives IMRx and QMRx from ADCs 186 and 188 of measurement receiver 115.

In one embodiment, the test tone is provided as $I_{Tx}$ on a line 225 and $Q_{Tx}$ on a line 230 to the DACs 120 and 122, respectively. $I_{Tx}$=cos (2π(m/N)n) and $Q_{Tx}$=sin(2π(m/N)n), where m/N=$f_{BB}$/Sample_Rate.

In general, RC/CR/bypass network is expected to cover a wide frequency range (e.g. several low bands).

A 90 Deg+/−5 Deg of RC/CR 162/166 relative phase shift (total shift) can be easily guaranteed by design over a very wide frequency range, however, relative phase to the bypass path 158 can vary by several degrees. Therefore, the three phases can be more generally described as: φ+ϑ−45,φ,φ+ϑ+45, where over a wide frequency range we expect −20°≤ϑ≤20°.

Also, attenuation level of the three paths 156, 158, 160 over a wide frequency range may vary by a few decibels (dBs). All of the above may be addressed by firmware or other processing to ensure the proper cancellation of the MRx HD3/HD5 components and amplification of the Tx HD3/HD5 components to be measured and calibrated as is known by one of average skill in the art.

Some benefits of cancellation of one or more of the MRx HD3/HD5 components may include improving Tx HD3/HD5 calibration by removing MRx measurement errors which in turn translates to a relaxation of the RFIC transceiver and PA design requirements making RF/analog implementation easier and faster to develop. In addition, distortion correction leads to a reduced RF front-end filter requirement, resulting in lower front-end loss and lower PA output power, which leads to longer talk time on a battery powered mobile device.

The RC/CR/bypass circuitry 156, 158, 160 is ideally designed to provide three phase shifts φ+ϑ−45,φ,φ+ϑ+45 respectively and three desired attenuations for a narrow range of LO frequencies such that adding the three MRx output measurements results in the cancellation of the MRx HD3 component and amplification of the components to be measured, namely Tx HD3 and Tx HD5. However, in practice, when this circuitry covers a wider RF frequency range (e.g. several low bands), the resulting phase shifts are more like ϕ−45,ϕ,ϕ+45, where typically −20°≤ϑ≤+20°, and the resulting attenuation through each path 156, 158, 160 ($\alpha_1$, $\alpha_2$, $\alpha_3$) can also vary by few dBs (e.g. 3-4 dB). FIG. 2 shows the phase and attenuation associated with each of the three paths.

To address the variations, additional processing may be performed in the firmware 220 (such as digital signal processing DSP firmware or digital hardware) to ensure the MRx generated HD3 and HD5 distortions are added destructively while the desired Tx HD3 and HD5 signals add constructively. To accomplish this, one of the three measurements, namely the bypass measurement with phase shift Ø and attenuation $\alpha_1$, is scaled by a complex factor $\hat{\beta}$ and $\hat{\gamma}$ to help cancel the MRx HD3 and MRx HD5 components respectively.

The normalized Tx CW test tone stimulus 210 input to the transmitter 110 after D/A conversion 120, 122 is $$s(t)=I(t)+jQ(t)=\cos(\omega_{IF}t)+j\sin(\omega_{IF}t)=e^{j\omega_{IF}t}$$

Ignoring the Tx image and LO leakage components and just focusing on the wanted, HD3 and HD5 components, the Tx RF output can be represented as $$x_{RF}(t) = \text{Real}\{[\hat{A}s(t) + \hat{B}s^{*3}(t) + \hat{C}s^5(t)]e^{j2\pi f_{LO}t}\}$$
$$= \text{Real}\{x_{BB}(t)e^{j2\pi f_{LO}t}\}$$

Where $\hat{A}$, $\hat{B}$, $\hat{C}$ are complex weights for the wanted, HD3 and HD5 components respectively and $f_{LO}$ is the Tx LO frequency. $X_{BB}(t)$ is the Tx complex baseband representation of the RF signal $x_{RF}(t)$.

For compactness, the LO carrier may be ignored, such that the complex baseband representation is used, namely $$X_{BB}(t)=\hat{A}s(t)+\hat{B}s^{*3}(t)+\hat{C}s^5(t)$$

$$x_{BB}(t)=\hat{A}e^{j\omega_{IF}t}+\hat{B}e^{-j3\omega_{IF}t}+\hat{C}e^{j5\omega_{IF}t}$$

The MRx generates its own HD3 and HD5 components. After MRx LO down-conversion to baseband, the resulting MRx complex baseband outputs for the three phase shifts, Ø, Ø+ϑ−45°, Ø+ϑ+45° and three attenuations $\alpha_1,\alpha_2,\alpha_3$ are $$y_{BB1}(t) =$$
$$\alpha_1 e^{j\phi}\tilde{G}_{MRx}x_{BB}(t-\tau_2) + D_1 e^{-j3[\theta_{Tx}+\phi]}s^{*3}(t-\tau_1) + E_1 e^{j5[\theta_{Tx}+\phi]}s^5(t-\tau_1)$$

$$y_{BB2}(t) = \alpha_2 e^{j[\phi+\theta-\frac{\pi}{4}]}\tilde{G}_{MRx}x_{BB}(t-\tau_2) +$$
$$D_2 e^{-j3[\theta_{Tx}+\phi+\theta-\frac{\pi}{4}]}s^{*3}(t-\tau_1) + E_2 e^{j5[\theta_{Tx}+\phi+\theta-\frac{\pi}{4}]}s^5(t-\tau_1)$$

$$y_{BB3}(t) = \alpha_3 e^{j[\phi+\theta+\frac{\pi}{4}]}\tilde{G}_{MRx}x_{BB}(t-\tau_2) +$$
$$D_3 e^{-j3[\theta_{Tx}+\phi+\theta+\frac{\pi}{4}]}s^{*3}(t-\tau_1) + E_3 e^{j5[\theta_{Tx}+\phi+\theta+\frac{\pi}{4}]}s^5(t-\tau_1)$$

Where $\tau_1$ and $\tau_2$ are the IF delays through the Tx and MRx paths, respectively, and $\tilde{G}_{MRx}$ is the MRx complex gain. In addition, $\theta_{Tx}$ is the phase of the output Tx wanted signal (input to the RC/CR/bypass circuitry) and $D_1, D_2, D_3$ are the resulting magnitudes of MRx HD3 for the three measurements. Similarly, $E_1, E_2, E_3$ are the magnitudes of MRx HD5 corresponding to the three measurements.

By using the reference Tx CW stimulus, s(t), and its $3^{rd}$ and $5^{th}$ order harmonics, a series of correlations can be carried out in firmware (or hardware) to compute the fundamental, HD3, and HD5 components. The correlation is done over an exact number of periods of the Tx CW stimulus. Increasing the number of periods will improve the averaging process by reducing measurement noise but will also increase the calibration time. Each correlation can be carried out in firmware or hardware.

Figure 3:
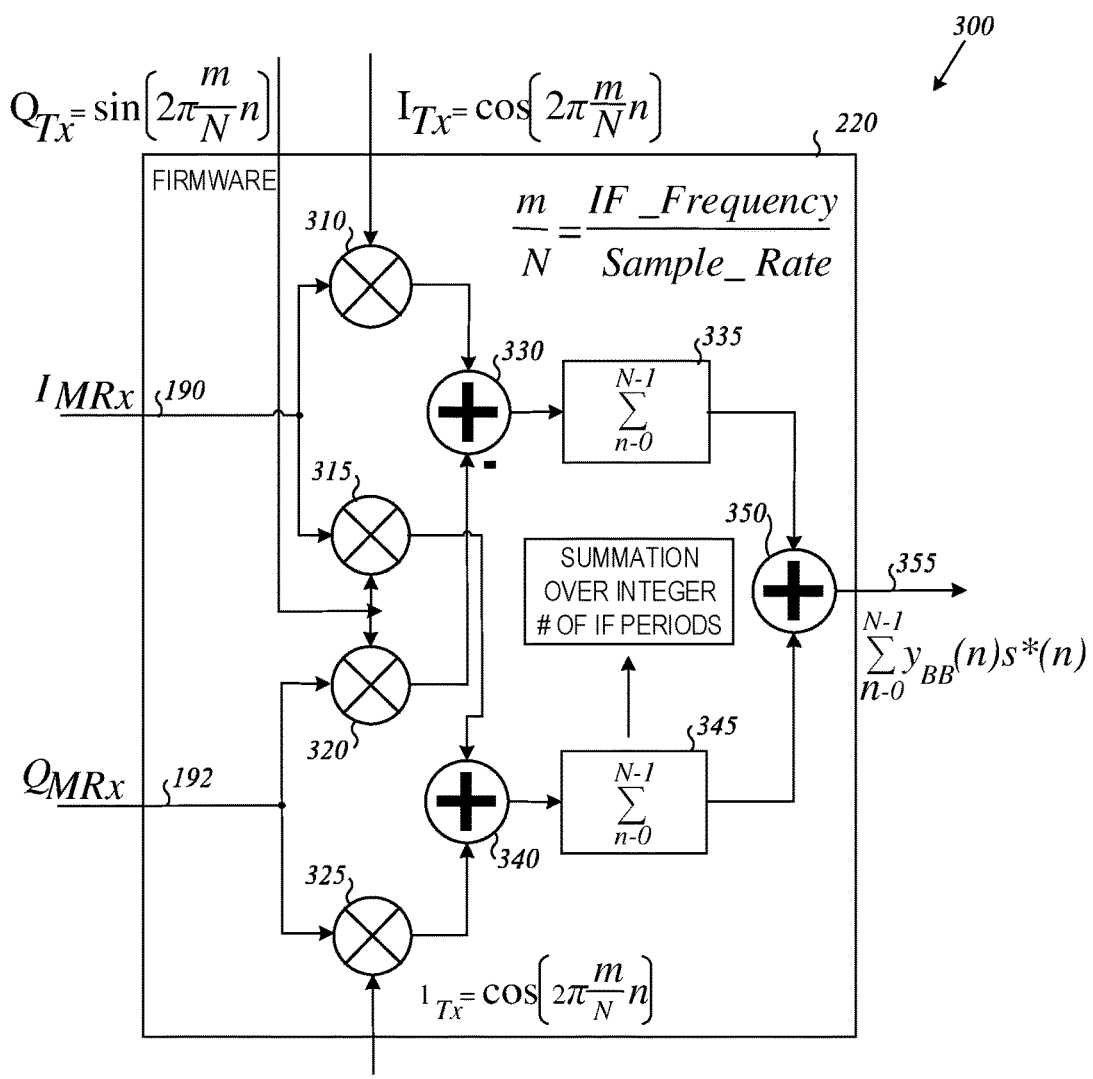
FIG. 3 is a block schematic representation of circuitry to perform correlation with a conjugate fundamental reference test tone according to an example embodiment.

A correlation with the conjugate fundamental reference test tone, $s^3(n)$, is shown in block schematic form at 300 in FIG. 3. In one embodiment, the measurement receiver outputs 190 and 192 are provided to the calibration calculator 220, and are multiplied with components of the continuous wave tone provided by digital tone generator 210 via four multipliers. A first multiplier 310 receives the respective I components. The measurement receiver I component is also provided to a second multiplier 315, which also receives the tone Q component. A third multiplier 320 receives the tone Q component and the measurement receiver Q component. A fourth multiplier 325 receives the measurement receiver Q component and the tone I component. A first adder 330 receives multiplied signals from multiplier 310 and multiplier 320, sums them, and provides them to a summing function 335. A second adder 340 receives multiplied signals from multipliers 315 and 325, providing a summed signal to a summing function 345. The summing functions provide summations over an integer number of IF periods. Outputs of the summing functions are added at adder 350 and provided as a summed output response to the test tone and measured signals as indicated at 355.

The correlation with the conjugate fundamental reference test tone is performed for each of the three measurements as selected by the multiplexer 154 to produce the following three complex correlation values on the fundamental tone:

$$\text{Fund\_Corr1} = \frac{1}{N}\sum_{n=0}^{N-1} y_{BB1}(n)s*(n) = \alpha_1 e^{j\phi}e^{-j\omega_{IF}(\tau_1+\tau_2)}\tilde{G}_{MRx}\hat{A}$$

$$\text{Fund\_Corr2} = \frac{1}{N}\sum_{n=0}^{N-1} y_{BB2}(n)s*(n) = \alpha_2 e^{j[\phi+\theta-\frac{\pi}{4}]}e^{-j\omega_{IF}(\tau_1+\tau_2)}\tilde{G}_{MRx}\hat{A}$$

$$\text{Fund\_Corr3} = \frac{1}{N}\sum_{n=0}^{N-1} y_{BB3}(n)s*(n) = \alpha_3 e^{j[\phi+\theta+\frac{\pi}{4}]}e^{-j\omega_{IF}(\tau_1+\tau_2)}\tilde{G}_{MRx}\hat{A}$$

Similarly, the correlation with the HD3 reference test tone ($s^3(n)$) produces the following three HD3 complex correlation values, where the terms before the addition symbol are Tx-generated and the terms following the addition symbol are MRx-generated:

$$\text{HD3\_Corr1} = \frac{1}{N}\sum_{n=0}^{N-1} y_{BB1}(n)s^3(n)$$
$$= \alpha_1 e^{j\phi}\tilde{G}_{MRx}e^{-j3\omega_{IF}\tau_2}\hat{B} + D_1 e^{-j3\omega_{IF}\tau_1}e^{-j3[\theta_{Tx}-\phi]}$$

$$\text{HD3\_Corr2} = \frac{1}{N}\sum_{n=0}^{N-1} y_{BB2}(n)s^3(n)$$
$$= \alpha_2 e^{j[\phi+\theta-\frac{\pi}{4}]}\tilde{G}_{MRx}e^{-j3\omega_{IF}\tau_2}\hat{B} +$$
$$D_2 e^{-j3\omega_{IF}\tau_1}e^{-j3[\theta_{Tx}+\phi+\theta-\frac{\pi}{4}]}$$

$$\text{HD3\_Corr3} = \frac{1}{N}\sum_{n=0}^{N-1} y_{BB3}(n)s^3(n)$$

-continued $$= \alpha_3 e^{j\left[\phi+\vartheta-\frac{\pi}{4}\right]} \tilde{G}_{MRx} e^{-j3\omega_{IF}\tau_2} \hat{B} +$$
$$D_3 e^{-j3\omega_{IF}\tau_1} e^{-j3\left[\theta_{Tx}+\phi+\vartheta+\frac{\pi}{4}\right]}$$

One of the three HD3 correlations is scaled in one embodiment, namely the bypass measurement HD3_Corr1, by a complex factor $\hat{\beta}$ such that the three unwanted MRx HD3 distortions add destructively while the three desired Tx HD3 components add constructively, specifically, $$\hat{\beta}HD3\_Corr1+HD3\_Corr2+HD3\_Corr3$$

The first two lines below comprise Tx components and the second two lines comprise MRx components $$\hat{\beta}\alpha_1 e^{j\phi} e^{-j3\omega_{IF}\tau_2} \tilde{G}_{MRx} \hat{B} +$$
$$\alpha_2 e^{j\left[\phi+\vartheta-\frac{\pi}{4}\right]} e^{-j3\omega_{IF}\tau_2} \tilde{G}_{MRx} \hat{B} + \alpha_3 e^{j\left[\phi+\vartheta+\frac{\pi}{4}\right]} e^{-j3\omega_{IF}\tau_2} \tilde{G}_{MRx} \hat{B}$$

and $$\hat{\beta}D_1 e^{-j3\omega_{IF}\tau_1} e^{-j3[\theta_{Tx}+\phi]} +$$
$$D_2 e^{-j3\omega_{IF}\tau_1} e^{-j3\left[\theta_{Tx}+\phi+\vartheta-\frac{\pi}{4}\right]} + D_3 e^{-j3\omega_{IF}\tau_1} e^{-j3\left[\theta_{Tx}+\phi+\vartheta+\frac{\pi}{4}\right]}$$

After factoring out common factors and rearranging, the goal for using the scaling factor $\hat{\beta}$ would be amplifying the wanted Tx HD3 distortion, namely $$\left|\hat{\beta}\alpha_1 + \alpha_2 e^{j\left[\vartheta-\frac{\pi}{4}\right]} + \alpha_3 e^{j\left[\vartheta+\frac{\pi}{4}\right]}\right| \geq \alpha_1$$

and cancelling out the MRx HD3 distortion, namely $$\hat{\beta} + \frac{D_2}{D_1} e^{-j3\left[\vartheta-\frac{\pi}{4}\right]} + \frac{D_3}{D_1} e^{-j3\left[\vartheta+\frac{\pi}{4}\right]} = 0 \quad \text{Eq. (1)}$$

it may be observed that $$\frac{D_2}{D_1} = \varepsilon \frac{\alpha_2}{\alpha_1} = \varepsilon \left|\frac{Fund\_Corr2}{Fund\_Corr1}\right| \quad \text{Eq. (2)}$$

and $$\frac{D_3}{D_1} = \varepsilon \frac{\alpha_3}{\alpha_1} = \varepsilon \left|\frac{Fund\_Corr3}{Fund\_Corr1}\right| \quad \text{Eq. (3)}$$

Where $\varepsilon$ is the rate of change of the magnitude of the MRx HD3 distortion with input attenuation level.

This factor can be predicted theoretically or evaluated using simulation or lab measurements. In addition, $$e^{j\left[\vartheta-\frac{\pi}{4}\right]} = \text{angle} \left|\frac{Fund\_Corr2}{Fund\_Corr1}\right| \quad \text{Eq. (4)}$$

And $$e^{j\left[\vartheta+\frac{\pi}{4}\right]} = \text{angle} \left|\frac{Fund\_Corr3}{Fund\_Corr1}\right| \quad \text{Eq. (5)}$$

After substituting Eqs. 2, 3, 4, & 5 into Eq. 1, the scaling factor $\hat{\beta}$ will be given by $$\hat{\beta} = -\varepsilon \left|\frac{Fund\_Corr2}{Fund\_Corr1}\right| e^{-j3\left[angle\left[\frac{Fund\_Corr2}{Fund\_Corr1}\right]\right]} -$$
$$\varepsilon \left|\frac{Fund\_Corr3}{Fund\_Corr1}\right| e - j3^{-j3\left[angle\left[\frac{Fund\_Corr3}{Fund\_Corr1}\right]\right]}$$

When $-20° \leq \vartheta \leq +20°$ and the three attenuations vary by several dBs, the $\hat{\beta}$ scaling factor will ensure that the desired Tx HD3 components to be monitored add constructively and the unwanted MRx HD3 components add destructively.

Using the same development, the HD5 scaling factor $\hat{\gamma}$ to scale the bypass measurement by to cancel out the MRx HD5 component may be $$\hat{\gamma} =$$
$$-\mu \left|\frac{Fund\_Corr2}{Fund\_Corr1}\right| e^{j5\left[angle\left[\frac{Fund\_Corr2}{Fund\_Corr1}\right]\right]} - \mu \left|\frac{Fund\_Corr3}{Fund\_Corr1}\right| e^{j5\left[angle\left[\frac{Fund\_Corr3}{Fund\_Corr1}\right]\right]}$$

Where $\mu$ is the rate of change of the magnitude of the MRx HD5 distortion with input attenuation level.

Figure 4:
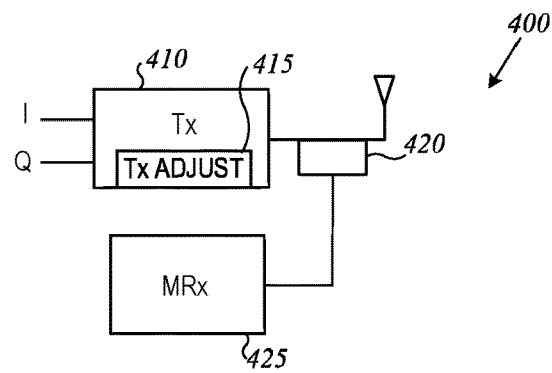
FIG. 4 is a block diagram representation of a transmitter with measurement receiver feedback to minimize harmonic distortion according to an example embodiment.

Once MRx HD3/HD5 are removed, a correct measurement or reading of the Tx HD3/HD5 may be obtained so when a relevant Tx parameter is adjusted to reduce the Tx HD3/HD5, an erroneous adjustment of that Tx parameter is not being made. At this point, after cancelling out the MRx HD3/HD5 components, the adjustment to be applied to the Tx path to reduce Tx HD3/HD5 at the MRx output can be one of any number of ways and is represented generically in block diagram form in FIG. 4 at 400.

In one example embodiment, the I/Q input to a transmitter 410 may be adjusted to compensate for the Tx HD3/HD5 in a way that resembles PA predistortion. The transmitter 410 output is measured at coupler 420 and monitored via measurement receiver 425 to adjust the I/Q input to reduce Tx HD3/HD5.

In further embodiments, a block 415 may adjust the Tx LO bias in an N-phase Tx architecture to reduce Tx HD3/HD5. Block 415 may alternatively represent the addition of a notch filter after Tx mixer at which point monitoring of the MRx output is used to adjust notch filter pole(s) location until the Tx HD3/HD5 are canceled or minimized. In general, there are many ways to employ the Tx adjustment block 415 to help reduce Tx HD3/HD5 as long as the MRx provides an accurate reading of the Tx harmonic distortions while performing these Tx adjustments utilize the complex scaling factor for such minimization.

Figure 5:
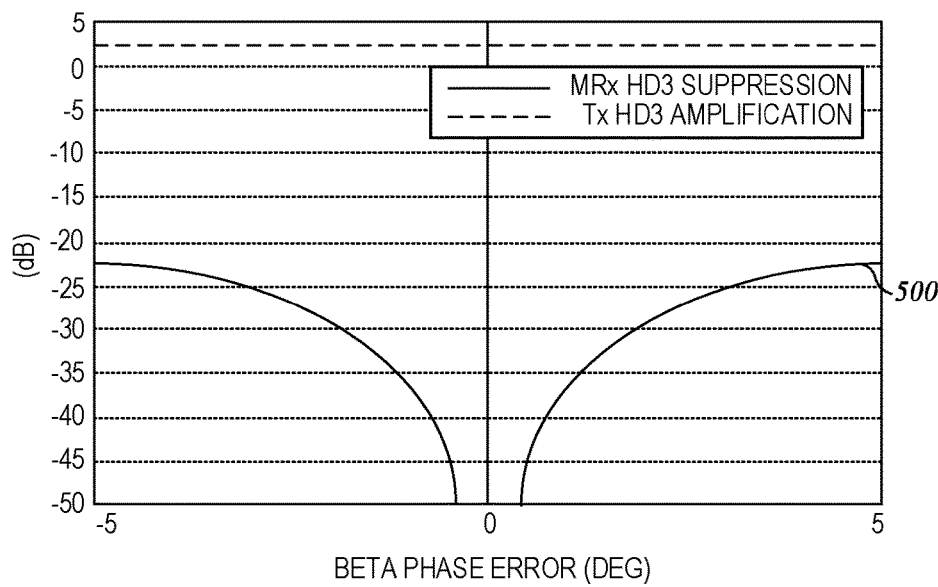
FIG. 5 is a graph illustrating performance in dB versus beta phase estimation error according to an example embodiment.
Figure 6:
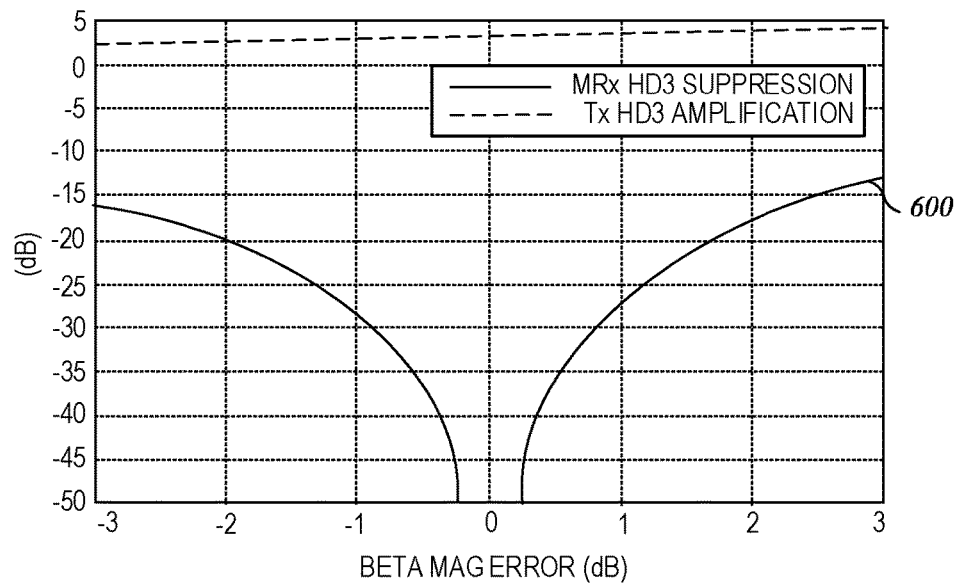
FIG. 6 is a graph illustrating performance in dB versus beta magnitude error in dB according to an example embodiment.

FIG. 5 is a graph of performance in dB versus beta phase estimation error indicated at 500. FIG. 6 is a graph of performance in dB verse beta magnitude error in dB indicated at 600. FIGS. 5 and 6 show the performance in the presence of $\hat{\beta}$ phase and magnitude estimation errors that can potentially result from measurement noise or non-perfect estimation of the factor $\varepsilon$. It can be seen that, even under phase error of +/−5 Deg and magnitude error of +/−3 dBs, a significant cancellation of the MRx HD3 is accomplished while at the same time amplification of the component to be measured, namely Tx HD3, is also achieved.

The advantage of doing three measurements as described above is that the MRx HD3/HD5 can be cancelled out for applications where an accurate reading of the Tx HD3/HD5 is utilized to optimize the Tx circuitry.

For other more common applications, an accurate reading of the Tx HD3 may be sufficient to optimize the Tx circuitry for that purpose. Thus the goal in this case would be to cancel or remove just the MRx HD3 to get an accurate reading of the Tx HD3. In this case, only two measurements with a relative phase of 90 Deg, namely, the RC and CR measurements 162 and 166, will be sufficient. Those skilled in the art can easily recognize that the RC and CR measurements can be guaranteed to have a relative phase difference very close to 90 deg over a wide range of frequencies covering several bands.

Figure 7:
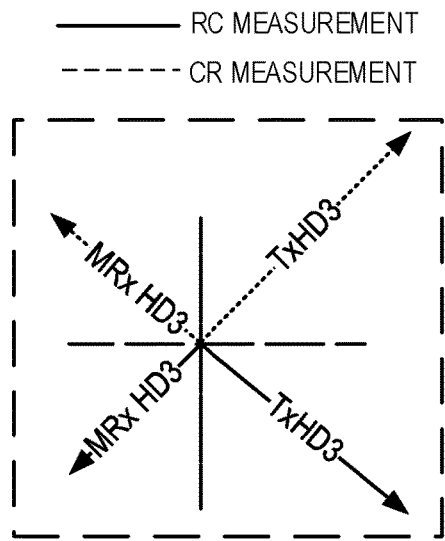
FIG. 7 is a chart showing a result of the RC and CR measurements in the complex I/Q plane according to an example embodiment.

FIG. 7 is a chart showing a result of the RC and CR measurements in the complex I/Q plane. It is clear from FIG. 7 that a simple counter clockwise 90 deg phase rotation of the RC measurement (the two solid lines) will line up the Tx HD3 components in phase while the MRx HD3 components will be 180 deg out of phase. The net result will be amplifying the Tx HD3 component to be measured while canceling the undesired MRx HD3 component. Any additional required amplitude alignment (due to a potential mismatch in amplitude attenuation of the RC and CR paths) can be easily obtained by those skilled in the art in firmware or hardware along the same lines described in the mathematical treatment used for the three (RC/R/CR) measurements.

Note that the two RC/CR measurements with a 90 Deg relative phase shift will not enable the cancellation of the MRx HD5, rather it can be easily shown that the required relative phase between the two measurements to cancel out the MRx HD5 is 45 deg.

Figure 8:
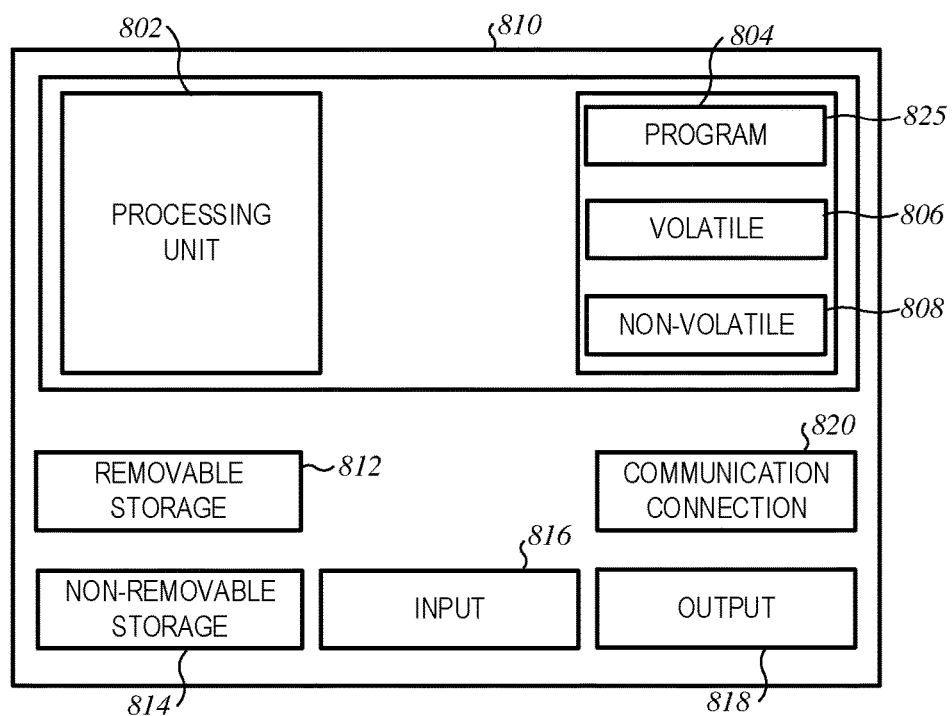
FIG. 8 is a block schematic diagram of circuitry for executing one or more components of the transmitter, test tone generation, and correction calculation circuitry to implement one or more methods according to an example embodiment.

FIG. 8 is a block schematic diagram of example processing circuitry such as a computer 810 to implement for executing one or more components of the transmitter, test tone generation, and correction calculation circuitry to implement one or more methods and other processing according to example embodiments. All components need not be used in various embodiments. One example computing device, in the form of a computer 810, may include a processing unit 802, memory 804, removable storage 812, and non-removable storage 814. Although the example computing device is illustrated and described as computer 810, the computing device may be in different forms in different embodiments. For example, the computing device may instead be part of a smartphone, a tablet, smartwatch, or other computing device including the same or similar elements as illustrated and described with regard to FIG. 8. Devices such as smartphones, tablets, and smartwatches are generally collectively referred to as mobile devices. Further, although the various data storage elements are illustrated as part of the computer 810, the storage may also or alternatively include cloud-based storage accessible via a network, such as the Internet.

Memory 804 may include volatile memory 806 and non-volatile memory 808. Computer 810 may include—or have access to a computing environment that includes—a variety of computer-readable media, such as volatile memory 806 and non-volatile memory 808, removable storage 812 and non-removable storage 814. Computer storage includes random access memory (RAM), read only memory (ROM), erasable programmable read-only memory (EPROM) and electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices capable of storing computer-readable instructions for execution to perform functions described herein.

Computer 810 may include or have access to a computing environment that includes input 816, output 818, and a communication connection 820. In one embodiment, the communication connection 820 is a transceiver operable to communicate via a wireless network, such as a cellular network. Output 818 may include a display device, such as a touchscreen, that also may serve as an input device. The input 816 may include one or more of a touchscreen, touchpad, mouse, keyboard, camera, one or more device-specific buttons, one or more sensors integrated within or coupled via wired or wireless data connections to the computer 810, and other input devices. The computer may operate in a networked environment using a communication connection to connect to one or more remote computers, such as database servers, including cloud based servers and storage. The remote computer may include a personal computer (PC), server, router, network PC, a peer device or other common network node, or the like. The communication connection may include a Local Area Network (LAN), a Wide Area Network (WAN), cellular, WiFi, Bluetooth, or other networks.

Computer-readable instructions stored on a computer-readable storage device are executable by the processing unit 802 of the computer 810. A hard drive, CD-ROM, and RAM are some examples of articles including a non-transitory computer-readable medium such as a storage device. The terms computer-readable medium and storage device do not include carrier waves. For example, a computer program 825 capable of providing a generic technique to perform access control check for data access and/or for doing an operation on one of the servers in a component object model (COM) based system may be included on a CD-ROM and loaded from the CD-ROM to a hard drive. The computer-readable instructions allow computer 810 to provide generic access controls in a COM based computer network system having multiple users and servers.

EXAMPLES

Example 1 is a transmitter that includes a power amplifier coupled to amplify an input signal and provide an output signal. A radio frequency coupler is coupled to receive the output signal and provide a measured signal on a coupler output. A measurement receiver multiplexor is coupled to receive the measured signal on the coupler output. Multiple receiver paths are coupled to the multiplexor to provide phase adjusted signals responsive to the measured signal. Measurement receiver outputs are coupled to receive the phase adjusted signals and provide phase separated digital measurement receiver output signals having canceled $3^{rd}$ and $5^{th}$ order measurement receiver distortions.

Example 2 includes the transmitter of example 1 wherein the receiver paths comprise an RC/CR/bypass network with phase settings of −45°, +45°, and 0°.

Example 3 includes the transmitter of any of examples 1-2 wherein the receiver paths include a first receiver path having a phase setting of −45°, a second receiver path having a phase setting of 0°, and a third receiver path having a phase setting of +45°.

Example 4 includes the transmitter of example 3 wherein the first receiver path comprises a resistor coupled to a capacitor that is coupled to ground, wherein the second receiver path comprises a resistor, and wherein the third receiver path comprises a capacitor coupled to a resistor that is coupled to ground.

Example 5 includes the transmitter of any of examples 3-4 wherein the second receiver path has an output scaled by a complex factor to reduce the measurement receiver 3rd and 5th order distortion components.

Example 6 includes the transmitter of any of examples 3-5 wherein the receiver paths are coupled to a pair of mixers, wherein each mixer is coupled to receive a measurement receiver square wave PLL output signal.

Example 7 includes the transmitter of example 6 wherein the mixers are coupled to respective programmable amplifiers and low pass filters to provide analog low pass filter outputs.

Example 8 includes the transmitter of example 7 wherein the low pass filters are coupled to analog to digital converters to provide the digital measurement receiver output signals as digital signals.

Example 9 includes the transmitter of any of examples 1-8 and further comprising a pair of mixers coupled to provide the input signal to the power amplifier, the mixers coupled to receive respective analog I and Q input signals and a transmit square wave PLL output signal.

Example 10 includes the transmitter of any of examples 1-9 wherein the phase separated digital measurement receiver output signals comprise Tx 3rd harmonic and 5th harmonic distortion components that add constructively.

Example 11 includes the transmitter of any of examples 1-11 and further including a digital tone generator coupled to provide the input signal to the power amplifier, and a calibration calculator coupled to the digital tone generator to receive a digital tone and coupled to receive the phase separated digital measurement receiver output signals and calculate a calibration factor.

Example 12 includes the transmitter of example 10 wherein the calibration factor operates to remove measurement receiver measurement errors and provide transmitter distortion correction.

Example 13 includes a method of providing a reference digital tone to a transmitter circuit, measuring an output of the transmitter circuit responsive to the reference digital tone, separating the measured output into phase separated paths, determining measured output desired, fundamental signal, $3^{rd}$ order, and $5^{th}$ order distortion components, and correlating the components with the reference digital tone and its harmonics to generate a scaling factor to reduce $3^{rd}$ and $5^{th}$ order measurement receiver distortions.

Example 14 includes the method of example 13 wherein the phase separated paths are provided by a bypass/RC/CR network with phase settings of $0, 0+\vartheta-45°$, $0+\vartheta+45°$ where $-20° \leq \vartheta \leq +20°$.

Example 15 includes the method of example 14 wherein the 0° path has an output scaled by a complex factor such that measurement receiver 3rd and 5th order distortion components add destructively with the transmitter 3rd and 5th order distortion components that add constructively.

Example 16 is a method including receiving a signal at a transmitter circuit, measuring an output of the transmitter circuit responsive to the received signal, separating the measured output into phase separated paths, determining measured output desired, fundamental signal, $3^{rd}$, and $5^{th}$ order distortion components phase adjusted outputs, and determining a scaling factor based on the measured output desired signal, $3^{rd}$, and $5^{th}$ order distortions to cancel the measurement receiver $3^{rd}$ and $5^{th}$ order distortions from the measured outputs of the transmitter circuit.

Example 17 includes the method of example 16 wherein the phase separated paths are provided by a bypass/RC/CR network with phase settings of $0, 0+\vartheta-45°$, $0+\vartheta+45°$ where $-20° \leq \vartheta \leq +20°$.

Example 18 includes the method of example 17 wherein the scaling factor is a complex factor.

Example 19 is a transmitter including a power amplifier coupled to amplify an input signal and provide an output signal. A radio frequency coupler is coupled to receive the output signal and provide a measured signal on a coupler output. A measurement receiver multiplexor is coupled to receive the measured signal on the coupler output to produce either a non-phase adjusted signal or a phase adjusted signal on one of a plurality of multiplexor outputs. Multiple receiver paths are coupled to the plurality of multiplexor outputs to receive either the non-phase adjusted signal or the phase adjusted signal. Receive path processing circuitry is configured to produce in-phase and quadrature phase digital signals based on the plurality of multiplexor outputs to digital processing circuitry to cancel $3^{rd}$ order measurement receiver distortions.

Example 20 includes the transmitter of example 19 wherein the receiver paths comprise an RC/CR network with phase settings of −45° and +45°.

Example 21 includes the transmitter of example 19 wherein the receiver paths include a first receiver path having a −45° phase shifted output signal and a second receiver path having a +45° phase shifted output signal.

Example 22 includes the transmitter of example 21 wherein the first receiver path comprises a resistor coupled to a capacitor that is coupled to ground, wherein the second receiver path comprises a capacitor coupled to a resistor that is coupled to ground.

Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

What is claimed is:

1. A transmitter comprising:
   a power amplifier coupled to amplify an input signal and provide an output signal;
   a radio frequency coupler coupled to receive the output signal and provide a measured signal on a coupler output;
   a measurement receiver including a multiplexor coupled to receive the measured signal on the coupler output to produce each of a non-phase adjusted signal and a phase adjusted signal on one of a plurality of multiplexor outputs;
   multiple receiver paths coupled to the plurality of multiplexor outputs to receive either the non-phase adjusted signal or the phase adjusted signal; and
   receive path processing circuitry configured to produce in-phase and quadrature phase digital signals based on the plurality of multiplexor outputs to digital processing circuitry to cancel $3^{rd}$ and $5^{th}$ order distortions introduced by the measurement receiver.

2. The transmitter of claim 1 wherein the multiple receiver paths comprise an RC/CR/bypass network with phase settings of −45°, +45°, and 0°.

3. The transmitter of claim 1 wherein the multiple receiver paths comprise:
   a first receiver path having a −45° phase shifted output signal;
   a second receiver path having a 0° phase shifted output signal; and a third receiver path having a +45° phase shifted output signal.

4. The transmitter of claim 3 wherein the first receiver path comprises a first resistor coupled to a first capacitor that is coupled to ground, wherein the second receiver path comprises a second resistor, and wherein the third receiver path comprises a second capacitor coupled to a third resistor that is coupled to ground.

5. The transmitter of claim 3 wherein the second receiver path has an output scaled by a complex factor to reduce the $3^{rd}$ and $5^{th}$ order distortion components introduced by the measurement receiver.

6. The transmitter of claim 3 wherein the multiple receiver paths are coupled to a pair of mixers, wherein each mixer is coupled to receive a square wave local oscillation for mixing with the output signals of the first, second, and third receiver paths to down convert the output signal.

7. The transmitter of claim 6 wherein the mixers are coupled to respective programmable amplifiers and low pass filters to provide analog low pass filter outputs.

8. The transmitter of claim 7 wherein the low pass filters are coupled to analog to digital converters to provide the digital measurement receiver output signals as digital signals.

9. The transmitter of claim 1 and further comprising a pair of mixers coupled to provide the input signal to the power amplifier, the mixers coupled to receive respective analog I and Q input signals and a square wave local oscillation signal.

10. The transmitter of claim 1 wherein the measurement receiver outputs phase separated digital output signals that comprise Tx $3^{rd}$ harmonic and $5^{th}$ harmonic distortion components that add constructively.

11. The transmitter of claim 1 and further comprising:
a digital tone generator coupled to provide the input signal to the power amplifier; and
a calibration calculator coupled to the digital tone generator to receive a digital tone and coupled to receive phase separated digital output signals from the measurement receiver and calculate a calibration factor.

12. The transmitter of claim 11 wherein the calibration factor operates to remove measurement receiver measurement errors and provide a more accurate reading of distortion of the transmitter.

13. A transmitter comprising:
a power amplifier coupled to amplify an input signal and provide an output signal;
a radio frequency coupler coupled to receive the output signal and provide a measured signal on a coupler output;
a measurement receiver including a multiplexor coupled to receive the measured signal on the coupler output to produce either a non-phase adjusted signal or a phase adjusted signal on each output of a plurality of multiplexor outputs;
multiple receiver paths coupled to the plurality of multiplexor outputs to receive either the non-phase adjusted signal or the phase adjusted signal; and
receive path processing circuitry configured to produce in-phase and quadrature phase digital signals based on the plurality of multiplexor outputs to digital processing circuitry to cancel $3^{rd}$ order distortions introduced by the measurement receiver.

14. The transmitter of claim 13 wherein the multiple receiver paths comprise an RC/CR network with phase settings of −45° and +45°.

15. The transmitter of claim 13 wherein the multiple receiver paths comprise:
a first receiver path having a −45° phase shifted output signal; and
a second receiver path having a +45° phase shifted output signal.

16. The transmitter of claim 15 wherein the first receiver path comprises a first resistor coupled to a first capacitor that is coupled to ground, wherein the second receiver path comprises a second capacitor coupled to a second resistor that is coupled to ground.

* * * * *